United States Patent [19]
Cooper

[11] Patent Number: 6,002,356
[45] Date of Patent: Dec. 14, 1999

[54] POWER SAVING FLASH A/D CONVERTER

[75] Inventor: Russell E. Cooper, Chandler, Ariz.

[73] Assignee: Microchip Technology Incorporated, Chandler, Ariz.

[21] Appl. No.: 08/953,374

[22] Filed: Oct. 17, 1997

[51] Int. Cl.[6] .................................................. H03M 1/36
[52] U.S. Cl. .......................................... 341/160; 341/159
[58] Field of Search ..................................... 341/159, 160

[56] References Cited

U.S. PATENT DOCUMENTS

| | | | |
|---|---|---|---|
| 4,417,233 | 11/1983 | Inuoe et al. ............................. | 341/159 |
| 4,602,241 | 7/1986 | Dingwall ................................. | 341/160 |
| 5,745,066 | 4/1998 | Hirooka et al. ......................... | 341/155 |

*Primary Examiner*—Howard L. Williams
*Attorney, Agent, or Firm*—Paul N. Katz; Ronald L. Chichester; Frohwitter

[57] ABSTRACT

Flash analog-to-digital (A/D) conversion is performed with an n-bit converter using a resistive-divider string in which tap points are taken between each pair of adjacent resistors of the string as one input to each of a respective plurality of $2^n-1$ comparators. Each of the comparators has a second input in common with all of the other comparators at which an analog input voltage to be converted to digital form is applied. A transition point occurs at one of the tap points at which immediately adjacent ones of the comparators exhibit outputs of different binary states for a given a sample of the analog input voltage, signifying the transition point is occurring at the highest-order digital output at which the sampled analog input voltage exceeds a reference voltage. The transition point is detected during each sample, at a location within a group of consecutive ones of the comparators of preselected number considerably less than the total number of comparators in the converter. All of the comparators in the converter except those in the group containing the transition point are deactivated to conserve power during the conversion process for the given sample.

7 Claims, 3 Drawing Sheets

POWER SAVING FLASH A/D CONVERTER

BACKGROUND OF THE INVENTION

The present invention relates generally to analog-to-digital conversion methods and devices, and more particularly to improvements in flash analog-to-digital conversion.

Analog-to-digital (A/D) conversion serves to transform a measured analog quantity to digital form, typically for such purposes as computer processing, digital display, or storage in data memory. Of the many different techniques available for A/D conversion, flash A/D conversion is among the fastest. The flash converter performs a simultaneous comparison that enables generating all of the bits in the binary output in parallel, unlike, for example, a successive approximation A/D converter in which the operation is performed in sequence so that a serial output is obtained running from most significant bit (MSB) to least significant bit (LSB).

Referring to FIG. 1, a typical prior art flash A/D converter 10 includes a resistor string or resistor ladder 12 which consists of a plurality of resistors that are seriesconnected between a positive voltage source ($V_R$+) and a negative voltage source ($V_R$-). In the circuit of FIG. 1, the resistor string is connected between +$V_{REF}$ and circuit ground. At taps between each pair of the resistors a circuit connection is made to the negative input of a respective comparator of a plurality of operational amplifier comparators 15 numbering one less than the number of resistors in the string, the string thus constituting a resistive voltage-divider circuit. The negative input to each comparator is therefore a reference voltage whose value depends on the position or connection of the respective comparator in the resistor string.

In general, the number of comparators required for conversion to an n-bit binary code is equal to $2^n-1$, i.e., $2^n-1$ intermediate states exist for $2^n$ binary states, and for every intermediate state there is an associated comparator which must be used for evaluation of the analog quantity. Thus, an 8-bit flash A/D converter offers extremely fast conversion time, but requires $2^8-1=256-1=255$ comparators, which represents a considerable challenge in implementation from the standpoint of device size. In the flash A/D converter 10 depicted in FIG. 1, n=3 so that only 8-1=7 comparators are needed.

The positive input to each comparator is the analog input voltage to be converted to digital format, and is common to each of the comparators. When the analog input voltage exceeds the reference voltage for a particular comparator the comparator will generate a high. The output of each of the comparators 15, representing the eight bits to be converted, is connected to a respective input of a binary encoder 17, according to the position of the comparator along the resistive divider. Thus, comparator 18, which is positioned in the voltage divider circuit to receive the largest percentage of reference voltage +$V_{REF}$ relative to the other comparators, is connected to input 7 of encoder 17, while comparator 20, which has the smallest percentage of the reference voltage applied to it, is connected to input 1 of encoder 17.

Encoder 17 is a "priority" encoder, so-called because its parallel 3-bit binary output code is determined by the highest order input that is a high (i.e., a "1"). For example, if the analog input voltage exceeds the reference voltage at comparator 21 but not at any comparator above 21 on the resistive divider at the time a sampling pulse is applied to the enable input EN of encoder 17, then comparator 21 and every comparator below 21 on the resistive divider will generate a high. But no comparator above 21 will go high.

In this example, then, encoder 17 will generate a binary code of 101 (i.e., equal to 5 in the decimal system), because the 5 input attributable to comparator 21 is the highest order input with a high output.

Not only is the A/D conversion of the flash converter extremely fast, but an analog signal can be converted to digital format with relatively high resolution if the sampling rate is high. These advantages tend to offset to some degree the disadvantage of the large number of comparators required for a high accuracy readout. But the device suffers from another significant drawback, namely, its relatively heavy power consumption with the multiplicity of comparators and encoder which are typically implemented on a semiconductor integrated circuit chip, for which low power dissipation is the desired status.

It is therefore a principal aim of the present invention to provide a flash A/D converter that affords considerable power saving over converters of that type heretofore available.

SUMMARY OF THE INVENTION

The invention resides in an intelligent flash A/D converter. As observed above, the conventional flash A/D converter comprises as many comparators as there are intermediate states for the particular number of binary states of the A/D. According to the invention, the comparator outputs are employed in a novel manner to turn on and off neighboring comparators at a transition point between active and inactive devices, in the sense of comparators which affect or do not affect the encoder output on conversion sampling, so as to conserve power consumption of the device.

As with the conventional flash A/D converter, tap points on a resistor string between voltages $V_{REF}$+ and $V_{REF}$-, are respectively coupled as one input to each of a plurality of comparators equal in number to the number of intermediate states of the converter (one less than $2^n$, where n is the number of bits for conversion). All comparators also have a second, common analog input voltage $V_{IN}$. But the invention differs from the conventional flash A/D converter, based on a recognition that the only comparators of interest along the string during any given sampling interval are those at the precise transition point where output differences exist when the analog input voltage is being sampled, i.e., where the outputs are distinguished by a transition between binary 1's and 0's. This transition can occur at only one pair of adjacent comparators, which is the transition or trip point. And when that point is established, only one or two, or a few at most, of the comparators at and about that point are allowed to remain on or active, while the other comparators are turned off or made inactive. om The continual turning on and off of at least some of the comparators along the resistor string as the analog input voltage undergoes rapid variation and relatively frequent sampling for the A/D conversion reduces circuit speed relative to a conventional flash A/D converter. Also, although its data output rate is still fast, the maximum change for the input voltage to the circuit is limited to the asynchronous tracking rate of the comparators and associated logic. These disadvantages are offset, however, by the power savings offered by the circuit relative to the power dissipation in a conventional flash A/D converter circuit. Typically, the power consumption of the conventional circuit is about 10 microamps ($\mu$A) per comparator, which is 10 $\mu$A×255 comparators=2.55 milliamps (mA) for an 8-bit converter. Since only a few comparators need be turned on at any given time in the flash circuit of the invention, perhaps only four or even two (although on some occasions more may be operating), much less power is consumed. For example, if four comparators are operating at 10 μA per comparator, the power consumption is only 40 μA.

The converter circuit of the invention may be used in semiconductor microcontroller devices, for example. However, the somewhat long, thin converter layout may not be as convenient as other converters for that application. Preferred applications are in stand-alone product situations in which flash A/D converters are commonly used, such as digitizing audio (particularly voice) frequencies in digital signal processing (DSP) functions, to filter out undesired components of the input signal. Flash A/D converters are sufficiently fast to provide real-time filtering and signal digitizing (such as in oscilloscopes), whereas other approaches such as successive approximation register (SAR) A/D devices are suitable for lower frequency applications since they are slower by the number of bits which must be serially determined, as well as track and hold time, if any.

Accordingly, it is a further important objective of the invention to provide a flash A/D converter in which only the comparator(s) at the transition point that determines the conversion value for the analog input signal being sampled are allowed to remain active, and all other comparators of the converter are shut down, to conserve power.

BRIEF DESCRIPTION OF THE DRAWINGS

The above and still further aims, objects, aspects, features and attendant advantages of the present invention will become apparent from a consideration of the following detailed description of the best mode currently contemplated for practicing the invention, encompassed by certain preferred methods and embodiments, taken in conjunction with the accompanying drawings, in which.

DETAILED DESCRIPTION OF A PREFERRED EMBODIMENT AND METHOD

According to the invention, a power saving flash A/D converter is provided which is effective to determine, during any given sampling time, those components or circuit portions which are appropriate to be powered on and those which may be powered off without substantial deleterious effect on circuit operation. Since only one or a limited number of comparators of the converter device have any significance during a particular analog input voltage sampling event, being the comparator(s) located at the transition or trip point which determines the digital value for that sample, only those comparators need be operational to provide an A/D conversion at that time.

Figure 1:
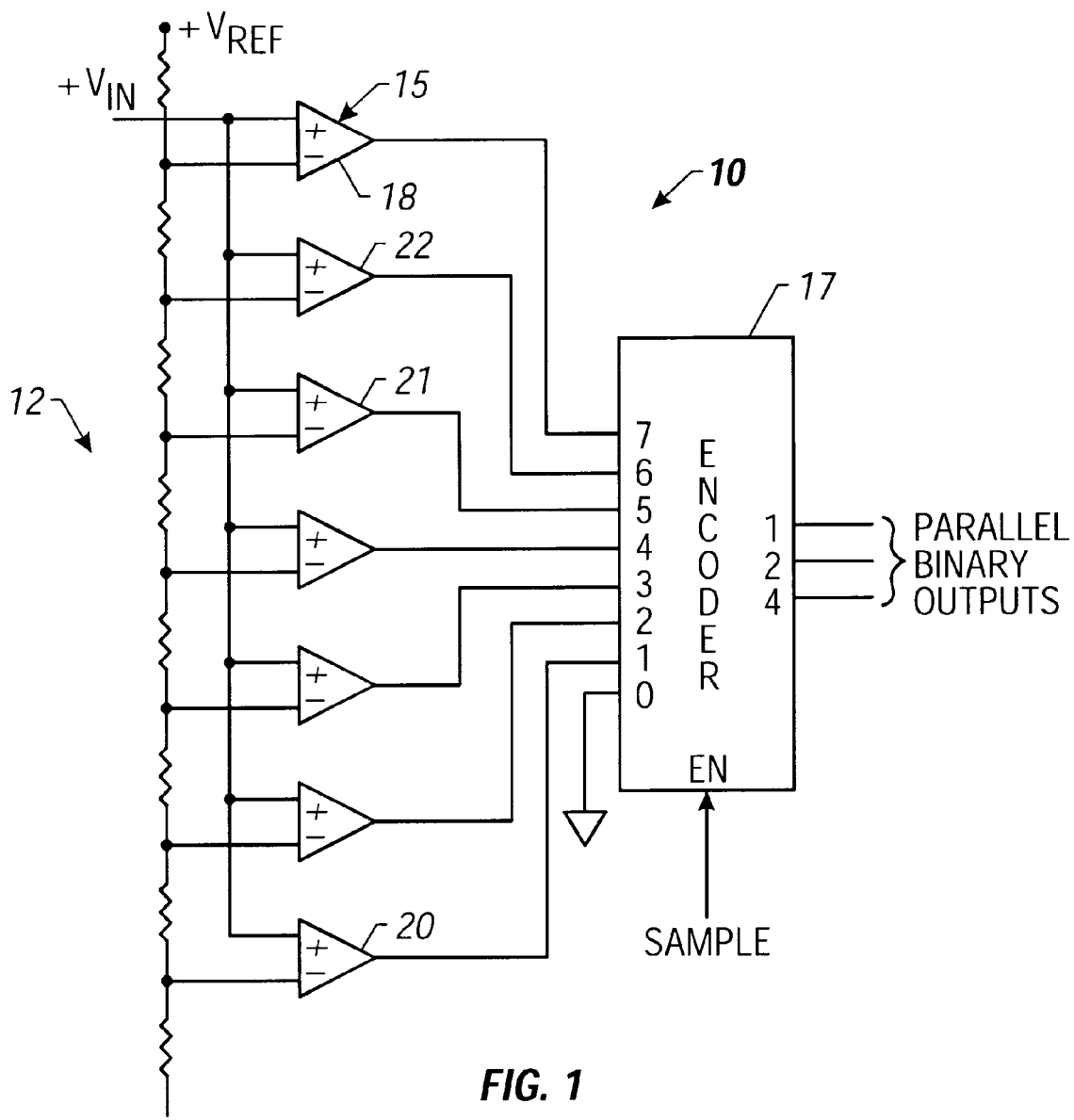
FIG. 1 is a simplified block diagram of a prior art flash A/D converter, discussed above.

In the conventional flash A/D converter of FIG. 1, each of the multiplicity of comparators 15 compares its own individual inverting input voltage from the respective tap taken along the resistor string 12 between $V_{REFHIGH}$ and $V_{REFLOW}$ (in FIG. 1, the latter being ground potential) at the two ends of the string, to the common analog input voltage $V_{IN}$ applied to all of the comparators, on each sampling occasion. If analog input voltage $V_{IN}$ exceeds the individual inverting voltage of the respective comparator (e.g., 21) along the string at a sampling event, but is less than the inverting voltage for any comparator which is higher than 21 in the string, then the output of comparator 21 is a 1 and is determinative of the binary output of encoder 17, since the outputs of all higher comparators (e.g., 22 and above) is a 0. Although each comparator below comparator 21 along resistor string 12 also has an output of 1 during that sample (because the sampled analog voltage is higher than its respective inverting voltage), encoder 17 responds only to the highest-order input (output of comparator 21) which is a 1. This is the trip point.

Now assume that converter 10 is an 8-bit flash A/D converter, so that the number of comparators is $2^8-1=255$ along the resistor string. In that case, with the transition point at the junction between comparator 21 and comparator 22, an 8-bit parallel binary output code will be derived, but in the process all 255 comparators are on at the same time because in this conventional layout, the analog input voltage $V_{IN}$ is continuously sampled for comparison with a respective reference voltage by each comparator at each tap point along the resistor string. Here again, the transition or trip point where a difference exists, i.e., the point between the comparator which has a 1 output and the comparator which has a 0 output, is the only true point of interest. The same would be true regardless of the number of bits in the flash A/D converter.

Figure 2:
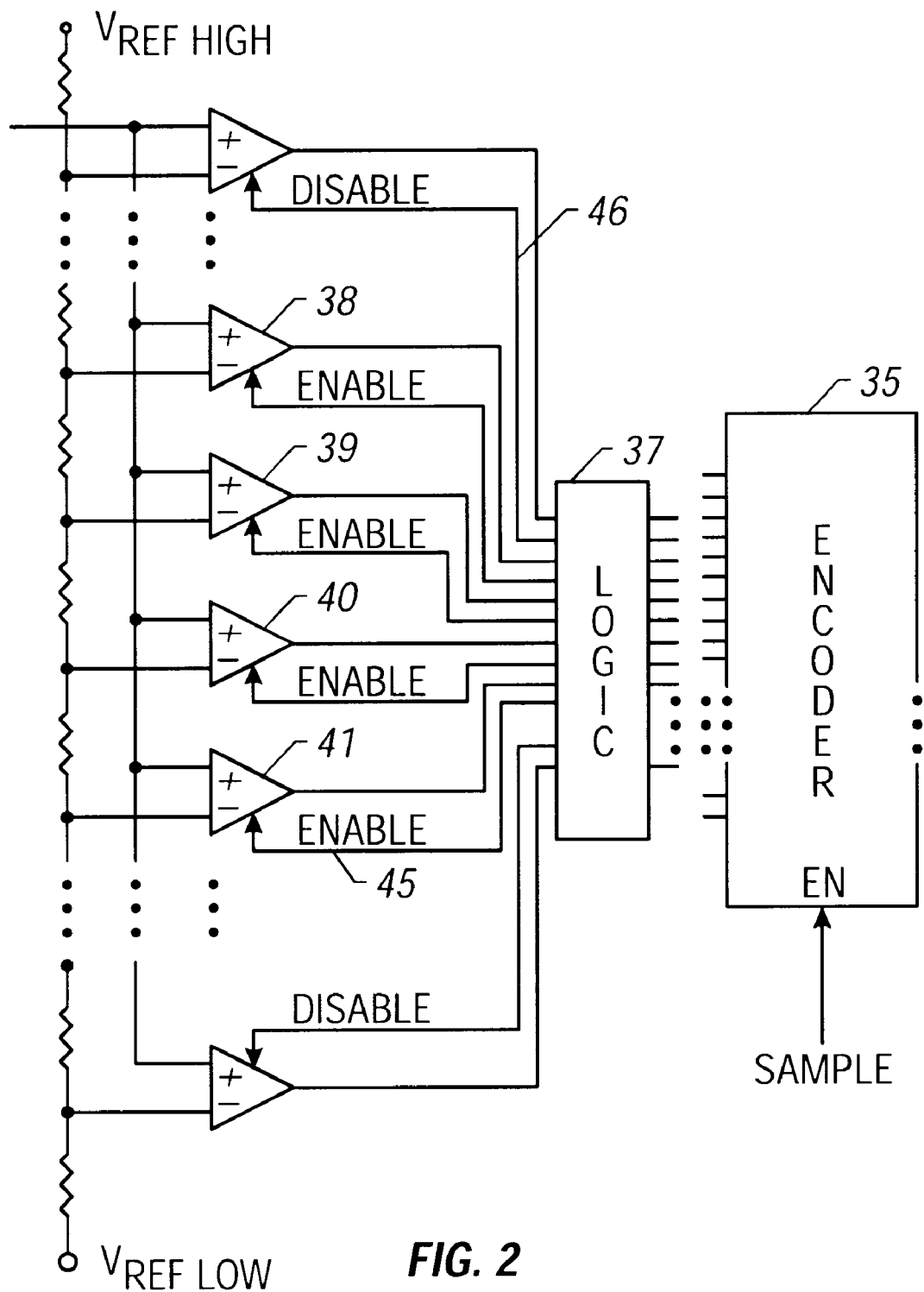
FIG. 2 is a block diagram of a presently preferred embodiment of a flash A/D converter according to the present invention.

Referring now to FIG. 2, assume, for example, that the analog input voltage $V_{IN}$ first exceeds the reference voltage (relative to the upper end of the resistor string) at a tap point 32 which is near the top of the resistive-divider string, at a time when a sampling pulse is applied to the enable input of the priority encoder 35. A logic circuit 37 is coupled to receive the outputs of a plurality of consecutive comparators, which may be all or a portion of the comparators in the converter—for example, a group of four comparators designated 38, 39, 40, and 41. Circuit 37 comprises logic which detects the point of transition between binary states, and in response, enables two comparators above and two comparators below the trip point. The same logic circuit serves to disable the comparators away from the trip point. It will be appreciated that only the comparators immediately above and below the trip point, or several comparators above and several comparators below the trip point, but considerably less than all of the comparators of the converter, may be enabled, and the rest disabled. To that end, logic circuit 37 supplies an enable input 45 to the preselected number of comparators above and below the trip point (in this example, 38 and 39 above, and 40 and 41 below), and a disable input 46 to each of the other comparators in the flash A/D converter. Alternatively, the converter may be adapted to go through the comparators in asynchronous fashion to individually shut off (i.e., power down) those that are inactive at any given moment.

As a consequence of the disabled output state of all comparators except those which are truly significant for any given sample—those being the comparators immediately at or about the trip point—, the conversion is focused on the principal region of interest and the power dissipation is markedly reduced in the overall converter during each sampling interval. In general, the trip point may and typically will change for each sample, but the operation will continue in an analogous fashion, with the trip point detected and the comparators at or about that point then being the only ones enabled.

From the foregoing, it will be understood that a method of flash A/D conversion is performed in an n-bit converter using a resistive-divider string in which tap points are taken between each pair of adjacent resistors of the string as one input to each of a respective plurality of $2^n-1$ comparators. Each of the comparators has a second input in common with all of the other comparators at which an analog input voltage to be converted to digital form is applied. A transition point occurs at one of the tap points at which a comparator having that tap point has an output of one binary bit and an immediately adjacent comparator has an output of an opposite binary bit upon taking a sample of the analog input voltage. This is indicative that the transition point is where the highest-order output representative of the analog input voltage exceeding the reference voltage occurs.

Figure 3:
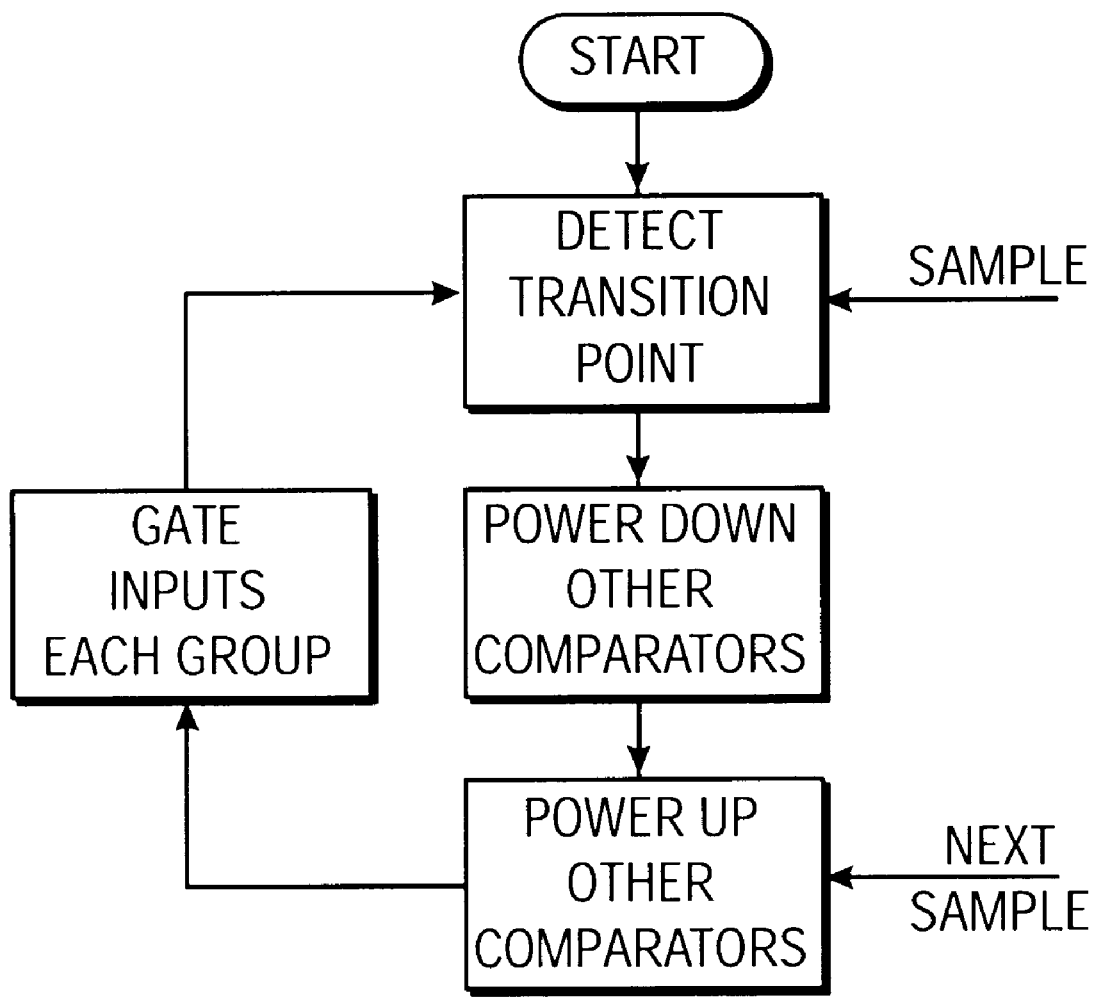
FIG. 3 is a flow diagram illustrative of a method according to the invention.

Referring to FIG. 3, the method includes detecting the transition point during one of the samples, as being located within a preselected number of consecutive comparators (e.g., two, four, six, etc.) considerably less than the number of comparators in the converter, and then powering down all of the other comparators in the converter, during the sample. For the next sample, if no change in analog input voltage has taken place, the transition point of the comparators remains the same. But if the analog input voltage has undergone a change in level since the last sample, the location of the new trip point is detected and all of the comparators are disabled except those located at or about the new trip point.

The location of the new trip point resulting from the change in location of the transition in binary state in consecutive samples is detected by use of an appropriate logic rule for each multiplicity of groups of comparators of the preselected number. For example, a gating function may be used to accept plural inputs equal to the number of comparators in each group, and to discern a difference in binary output of adjacent units in the group.

By virtue of the operation of the circuit of the present invention, the active comparators of the converter differ, i.e., appear to undergo movement, with each change in the analog input signal voltage. Because all of the comparators are not on at all times, the circuit is is actually performing a pseudo-flash conversion. Nevertheless, the A/D conversion of the analog signal is achieved at relatively high speed, although a true flash A/D converter is somewhat faster than the psuedo flash converter of the invention.

If the analog input voltage $V_{IN}$ is undergoing wide fluctuation, it may be desirable to perform a sample and hold operation for each sample. An example of such a situation is where the input voltage is derived from an audio signal that ranges from say, 300 Hz to 30 Khz. In that case, it is preferable that the analog input voltage be sampled more frequently for conversion to a digital form. For such an application, although the flash A/D converter concept is very convenient because it allows rapid sampling of the input, its efficiency is somewhat degraded by a need for more frequent and increased search time to effect a conversion. It is not necessary to perform a sample and hold if catch-up time is allowable, such as with battery recharging systems. There, the system is turned on, allowed to track through the resistive-divider string to find the input voltage value, and thereafter to simply track in a manner similar to that of a sigma-delta converter. For the latter, several cycles may pass before the system catches up to the input voltage, but once that occurs, tracking is very efficient.

To provide further efficiency in tracking a widely fluctuating voltage, a set of eight, sixteen, or more consecutive devices may be tested (for detection of the trip point) at the same time, and simultaneously at each end of the resistor string. Since the testing may be performed in a continuous asynchronous manner up and down the string, it is not necessary that a clock be involved in such an operation. For any number of comparators in a group, a logic circuit with the same even number of inputs may be used for detecting the trip point.

Preferably, the pseudo-flash converter of the invention is used in a system in which the input voltage is tracked continuously for greater efficiency. This avoids the need for conducting a search with each sampling of $V_{IN}$, as opposed to a multiplexed input system. In circumstances of a slowly varying input voltage, the comparators and their associated logic are capable of tracking its movement in an asynchronous manner, without need for special search techniques.

Thus, the invention is preferred for applications in which changes in input voltage level are not likely to occur rapidly, such as in temperature sensing, pressure sensing, voice communications, voice recognition systems, and so forth. The overall device not only possesses the capability to continuously track an input voltage at high speed and to effect the desired A/D conversion, but to do so with very low power consumption. As long as the input voltage moves at a rate slower than the tracking rate, the pseudo-flash converter of the invention produces virtually instantaneous continual conversion.

Although a best mode currently contemplated for practicing the invention has been described herein, in conjunction with certain preferred methods and embodiments, it will be recognized by those skilled in the relevant art that variations and modifications of the disclosed methods and embodiments may be made without departing from the true spirit and scope of the invention. For example, the comparator outputs may be decoded by use of a scheme other than a priority encoder, such as forcing the outputs of the disabled comparators to a "regional" state. Accordingly, it is intended that the invention shall be limited only by the appended claims and the rules and principles of the applicable law.

What is claimed is:

1. A method of performing a flash analog-to-digital (A/D) conversion in an n-bit converter using a resistive-divider string in which tap points are taken between each pair of adjacent resistors of the string as one input to respective ones of a plurality of $2^n-1$ comparators, where n is the number of bits for the digital output, each of said comparators having a second input in common with all of the other said comparators, at which an analog input voltage to be converted to digital form is applied, and a transition point constituting different binary output states between immediately adjacent ones of said comparators upon taking a sample of the analog input voltage signifying the tap point at which the highest-order output representative of the analog input voltage exceeding the reference voltage is occurring, said method comprising the steps of:

(a) detecting the transition point during said sample as being located between a preselected number of immediately adjacent ones of said comparators, wherein said immediately adjacent ones are considerably less in number than the total number of comparators in the converter, and (b) powering down all of said comparators in the converter except those immediately adjacent ones of said comparators during said sample, the comparators in said immediately adjacent ones representing the region of particular interest for digital conversion of said sample.

2. The method of claim 1, further including the steps of:

(c) powering up all comparators in the converter upon taking a new sample of the analog input voltage, and repeating steps (a) and (b) of claim 1.

3. The method of claim 2, wherein the step of detecting the location of the transition point, including any change in location of the transition point in consecutive samples of the analog input voltage, is performed by logic circuitry that recognizes a difference in binary output states of immediately adjacent comparators as occurring at only one tap point.

4. The method of claim 3, wherein said logic circuitry is connected to an output from each one of said comparators.

5. The method of claim 1, wherein the step of detecting the transition point during said sample is performed by the step of comparing logic level outputs of immediately adjacent ones of said comparators until different logic levels are found.

6. A flash analog-to-digital (A/D) converter of n-bits, having a resistive-divider string in which tap points are taken between each pair of adjacent resistors of the string as one input to respective ones of a plurality of $2^n-1$ comparators, where n is the number of bits for the digital output, each of said comparators having a second input in common with all of the other said comparators, at which an analog input voltage to be converted to digital form is applied, and a transition point constituting different binary output states between immediately adjacent ones of said comparators upon taking a sample of the analog input voltage signifying the tap point at which the highest-order output representative of the analog input voltage exceeding the reference voltage is occurring, said converter further comprising:

first logic circuits for detecting the transition point during one said single sample as being located between a preselected number of immediately adjacent ones of said comparators, wherein said immediately adjacent ones are considerably less in number than the total number of comparators in the converter, and second logic circuits for powering down all of said comparators in the converter except those immediately adjacent ones of said comparators during said singe sample, the comparators in said immediately adjacent ones representing the region of particular interest for digital conversion of said since sample.

7. The flash A/D converter of claim 6, wherein said first logic circuits for detecting the transition point includes third logic circuits for detecting any change in the transition point in consecutive samples of the analog input voltage, including fourth logic circuitry that recognizes a difference in binary output states of immediately adjacent comparators as occurring at only one tap point.

\* \* \* \* \*